United States Patent
Li et al.

(10) Patent No.: US 11,784,113 B2
(45) Date of Patent: Oct. 10, 2023

(54) MULTILAYER PACKAGE SUBSTRATE WITH STRESS BUFFER

(71) Applicant: Texas Instruments Incorporated, Dallas, TX (US)

(72) Inventors: Guangxu Li, Allen, TX (US); Yiqi Tang, Allen, TX (US); Rajen Manicon Murugan, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 6 days.

(21) Appl. No.: 17/233,110

(22) Filed: Apr. 16, 2021

(65) Prior Publication Data

US 2021/0327794 A1    Oct. 21, 2021

Related U.S. Application Data

(60) Provisional application No. 63/011,295, filed on Apr. 17, 2020.

(51) Int. Cl.
| | | |
|---|---|---|
| *H01L 23/498* | (2006.01) | |
| *H01L 23/00* | (2006.01) | |
| *H01L 21/48* | (2006.01) | |

(52) U.S. Cl.
CPC .... *H01L 23/49811* (2013.01); *H01L 21/4857* (2013.01); *H01L 23/49822* (2013.01); *H01L 23/49838* (2013.01); *H01L 24/13* (2013.01); *H01L 24/16* (2013.01); *H01L 2224/1357* (2013.01); *H01L 2224/13147* (2013.01); *H01L 2224/16227* (2013.01)

(58) Field of Classification Search
CPC ........... H01L 23/49811; H01L 21/4857; H01L 23/49822; H01L 23/49838; H01L 24/13; H01L 24/16; H01L 2224/13147; H01L 2224/1357; H01L 2224/16227; H01L 23/3121; H01L 2221/68345; H01L 2221/68359; H01L 21/6835

See application file for complete search history.

(56) References Cited

U.S. PATENT DOCUMENTS

| | | | |
|---|---|---|---|
| 3,033,014 A1 | 10/2011 | Yu et al. | |
| 2017/0345762 A1* | 11/2017 | Chiu | ............... H01L 23/5389 |
| 2021/0242145 A1* | 8/2021 | Shindo | ............... H01L 24/05 |
| 2021/0327790 A1* | 10/2021 | Murugan | .......... H01L 23/49827 |
| 2022/0102260 A1* | 3/2022 | Cole | .................. H02M 1/0048 |

\* cited by examiner

*Primary Examiner* — Douglas W Owens
(74) *Attorney, Agent, or Firm* — Ronald O. Neerings; Frank D. Cimino (57) ABSTRACT

A semiconductor package includes a multilayer package substrate including a top layer including a top dielectric layer and a top metal layer providing a top portion of pins on top filled vias, and a bottom layer including a bottom dielectric layer and a bottom metal layer on bottom filled vias that provide externally accessible bottom side contact pads. The top dielectric layer together with the bottom dielectric layer providing electrical isolation between the pins. And integrated circuit (IC) die that comprises a substrate having a semiconductor surface including circuitry, with nodes connected to bond pads with bonding features on the bond pads. An electrically conductive material interconnect provides a connection between the top side contact pads and the bonding features. At least a first pin includes at least one bump stress reduction structure that includes a local physical dimension change of at least 10% in at least one dimension.

20 Claims, 9 Drawing Sheets

MULTILAYER PACKAGE SUBSTRATE WITH STRESS BUFFER

CROSS REFERENCE TO RELATED APPLICATIONS

This application claims the benefit of Provisional Application Ser. No. 63/011,295 entitled "Mechanically Optimized Structures using Routable Leadframe Technology", filed Apr. 17, 2020, which is herein incorporated by reference in its entirety.

FIELD

This Disclosure relates to flipchip on lead packages.

BACKGROUND

A variety of semiconductor chip packages (semiconductor packages) are known that provide support for an integrated circuit chip (IC) die and associated bond wires, provide protection from the environment, and enable surface mounting of the IC die to and interconnection with a printed circuit board (PCB). One conventional package configuration includes a leadframe having a die pad and leads also called wire bond pads. Leadframe semiconductor packages are well-known and widely used in the electronics industry to house, mount, and interconnect a variety of integrated circuits (ICs). The IC die can be mounted to the leadframe top side up, and bond wires are used to electrically connect the bond pads to leads, or the IC die can be mounted to the leadframe with the top side down in what is termed a flipchip arrangement.

In a flipchip arrangement, an IC die having solder bumps on its bond pads, such as solder on copper posts (or pillars) that are on the bond pads, is flipped onto a leadframe. Flip-chip assembly technology is widely utilized in semiconductor packaging due to its short interconnect paths between the flip-chip die and a substrate, which also eliminates the space needed for wire bonding and thus reduces the overall size of the package. In addition, the elimination of wire bonds reduces undesired parasitic inductance, making the flipchip package attractive for high-frequency applications.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional flipchip on lead packages having solder bumps included in their interconnection can experience high stress which can cause cracking of the solder joint or other electrically conductive material interconnect, cracking of the interlayer dielectric (ILD) of the IC, and/or package delamination in the case of a package substrate. Any of these problems can result in a reduced packaged device yield and/or reliability problems in the packaged device's application. A multilayer package substrate having a routable structure and metal plating processing for forming the metal layers is recognized to provide flexible and relatively fine design rules to effectively create new structures that function to mitigate the stress of the solder or other electrically conductive material interconnect including for reducing cracking of the interconnect, where such structures are referred to herein as being 'bump stress reduction structures" (BSRS's). The multilayer package substrate is typically a two-layer construction (each including a metal layer and a dielectric layer), with filled vias through a thickness of the dielectric layer for connecting the respective metal layers. However, disclosed packaged substrates can also optionally include three or more layers.

Disclosed aspects include a semiconductor package includes a multilayer package substrate including a top layer including a top dielectric layer and a top metal layer providing a top portion of pins on top filled vias, and a bottom layer including a bottom dielectric layer and a bottom metal layer on bottom filled vias that provide externally accessible bottom side contact pads. The top dielectric layer together with the bottom dielectric layer providing electrical isolation between the pins. An IC die that comprises a substrate having a semiconductor surface includes circuitry, with nodes connected to bond pads with bonding features on the bond pads. An electrically conductive material interconnect provides a connection between the top side contact pads and the bonding features. At least a first pin includes at least one bump stress reduction structure that includes a local physical dimension change of at least 10% in at least one dimension. In this case the IC die comprises a power IC die, the pins can comprise an plurality of input/output (I/O) pins, a ground pin, and at least one power bus bar.

BRIEF DESCRIPTION OF THE DRAWINGS

Reference will now be made to the accompanying drawings, which are not necessarily drawn to scale, wherein:

FIGS. 4A-I show steps for forming a disclosed multilayer package substrate of an assembly method for forming a disclosed flipchip semiconductor package including a multilevel package substrate having at least one pin having a BSRS for improving a reliability of the package, according to an example aspect.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Several terms used herein will now be defined. A multilayer package substrate as used herein is a particular package substrate arrangement that comprises a plurality (at least two) of stacked layers where each layer is pre-configured with metal plating such as copper plating or interconnects to provide electrical connections in the package. Such a package substrate is generally built by forming a dielectric layer such as a mold compound (generally comprising an epoxy material) or other organic compound(s) around a leadframe substrate comprising a metal material between a patterned top metal layer and a patterned metal bottom layer. Such package substrates can comprise single- or multi-die configurations, both lateral and vertically stacked, enabling low-profile, fine-pitch packages, which enable different stackups, material, and manufacturing process, that has recognized benefits when applied to disclosed aspects.

An IC die as used herein comprises a substrate having at least a semiconductor surface (generally an all-semiconductor substrate, such as comprising silicon having an optional epitaxial layer thereon), where there were circuit elements (including transistors, and generally diodes, resistors, capacitors, etc.) formed in the semiconductor surface that are configured together for generally realizing at least one circuit function. Various nodes of the circuitry are coupled to bond pads on the top side of the IC, where the bond pads generally comprise the top layer metal. The IC can generally comprise a power device.

A bus bar, sometimes simply referred to as a bus, as used herein is a pin of a multilayer package substrate that comprises multiple metal layers that runs from one side of the package to an opposite side or along a length of a given side of the package, such as for providing power supply rail for a plurality of nodes on the IC die.

Figure 1A:
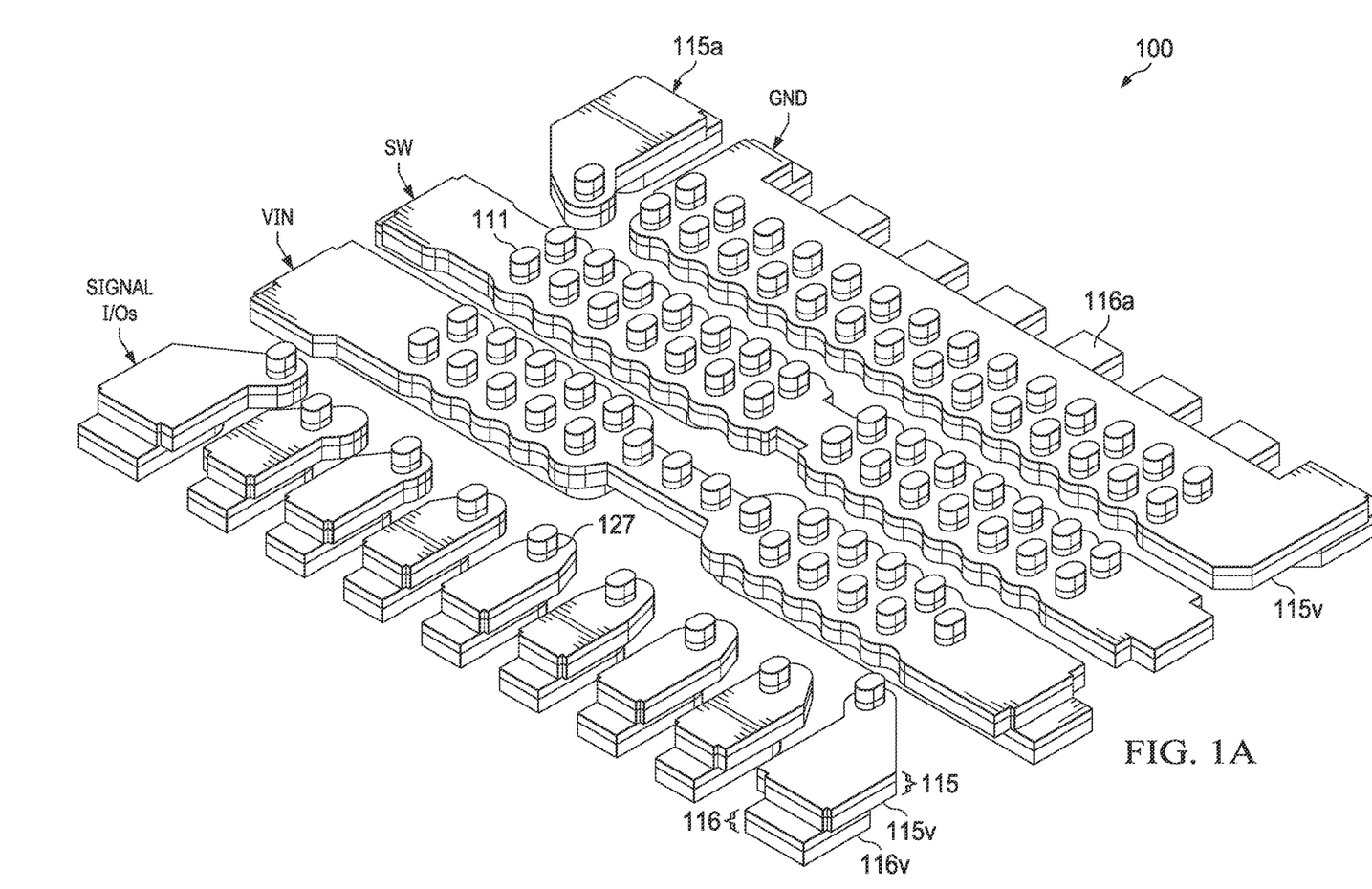
FIG. 1A is a top perspective view of a disclosed multilevel package substrate for flipchip mounting a power IC device thereon.

FIG. 1A is a top perspective view of a disclosed multilevel package substrate 100 for flipchip mounting an IC, that can be a power IC, thereon. The multilayer package substrate 100 includes a top layer 115 that comprises a top filled via 115v formed through a top dielectric layer (not shown) 115b and a top metal layer 115a extending to a top side of the top dielectric layer. Below the top layer 115 is a bottom layer 116 comprising bottom filled vias 116v formed through a bottom dielectric layer (not shown, but see FIG. 2 described below) and a bottom metal layer 116a extending to a top side of the bottom dielectric layer. The bottom filled vias provide externally accessible bottom side contact pads, such as to a printed circuit board (PCB). The multilevel package substrate 100 is shown with the pins comprising a stack comprising the top metal layer 115a, top filled vias 115v, bottom metal layer 116a, shown providing a GND pin, a switch (SW) pin, a VIN pin, each shown being in a bus bar figuration, and also conventional pins shown as signal I/O pins.

At least one pillar 111 (from an IC die that will be mounted thereon) is shown on each of the pins, that can also comprise solder balls, where in the case of pillars 111 they are generally solder capped, which are on bond pads of an IC die that is configured to be mounted on the top side of the multilevel package substrate 100. There is also an electrically conductive attach material 127 such as solder, sintered silver particles, or an electrically conductive epoxy, shown between the pillars 111 and the respective pins of the multilevel package substrate 100, where the electrically conductive attach material 127 is recognized herein to be susceptible to cracking.

Figure 1B:
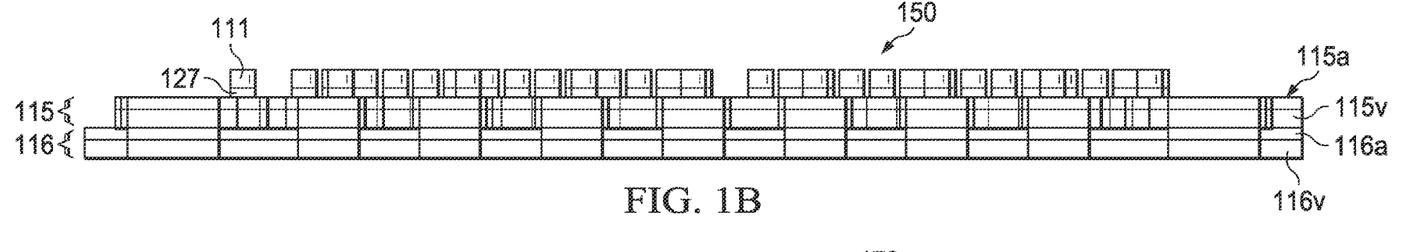
FIG. 1B is a side view of the disclosed multilevel package substrate taken in a length direction along the GND (ground) pin shown in FIG. 1A.
Figure 1C:
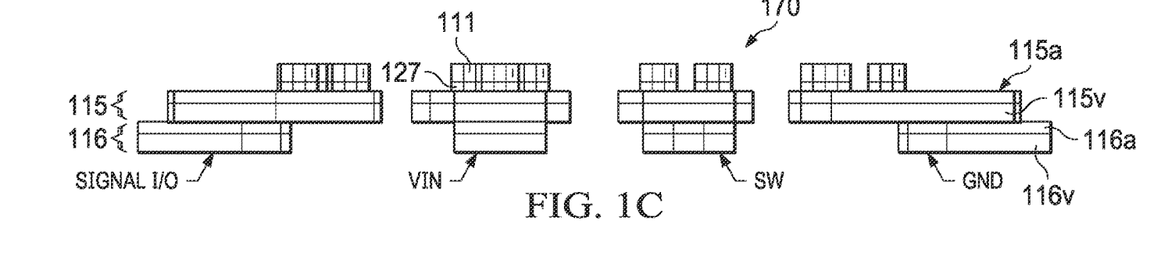
FIG. 1C is a side view of the disclosed multilevel package substrate taken along a width direction showing the GND pin, the switch (SW) pin, the VIN (input voltage) pin, and the signal I/O pins shown in FIG. 1A. Pillars on bond pads of an IC to be bonded to pins of the multilevel package substrate are also shown.

FIG. 1B is a side view of the disclosed multilevel package substrate 100 taken in a length direction along the GND pin shown in FIG. 1A, shown as 150. FIG. 1C is a side view of the disclosed multilevel package substrate 100 taken along a width direction showing the GND pin, the SW pin, the VIN pin, and signal I/O pin shown as 170.

Figure 2:
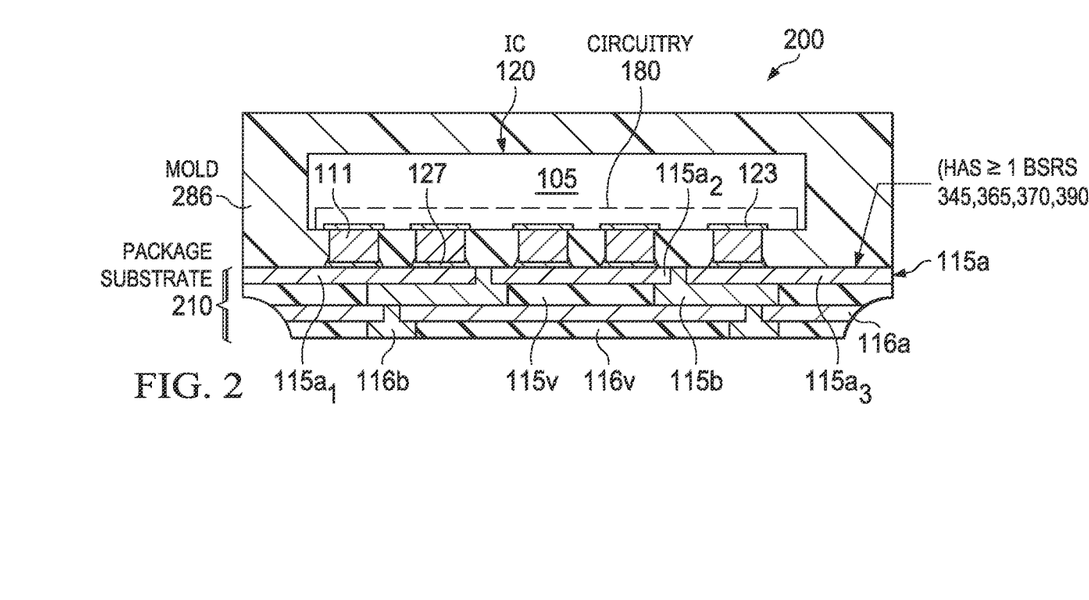
FIG. 2 is a cross-sectional view of a flipchip semiconductor package including an IC die having pillars on its bond pads that is flipchip mounted on a disclosed multilevel package substrate having at least one BSRS, according to an example aspect. Although no BSRS is shown in FIG. 2, the semiconductor package includes one or more of the BSRS's as shown in FIGS. 3A-3D described below, respectively.

FIG. 2 is a cross-sectional view of a flipchip semiconductor package 200 configured as a no lead package, such as a quad flat no lead (QFN) package, including an IC die 120 comprising a substrate 105 that includes circuitry 180. Nodes of the circuitry 180 are coupled to bond pads 123 that have a bonding feature shown as a pillar 111 thereon, where the IC die 120 is flipchip mounted on a disclosed multilevel package substrate shown as 210. Although the multilevel package substrate 210 has at least one pin having at least one BSRS, no BSRS is shown in FIG. 2 due to limitations of the cross-sectional view. However, the flipchip semiconductor package 200 for at least one of its pins includes one or more of the BPRSs shown in FIGS. 3A-3D described below.

There is shown an electrically conductive material interconnect 127, such as a layer of solder, between the tips of the pillars 111 and the respective portions of the top metal layer 115a shown as top metal portions 115a1, 115a2, and 115a3. The pin associated with the top metal portion 115a3 is shown in parentheticals having ≥1 BSRS selected from BSRS 345 shown in FIG. 3A described below, the BSRS 365 shown in FIG. 3B described below, the BSRS 370 shown in FIGS. 3B and 3C described below, and the BSRS 390 shown in FIG. 3D described below. The top metal filled vias (filled vias) are shown as 115v which are through a portion of the thickness of the top dielectric layer 115b. The bottom layer is shown comprising a bottom metal layer 116a on bottom metal vias 116v formed through a portion of the thickness of the bottom dielectric layer 116b. The top dielectric layer 115b together with the bottom dielectric layer 116b can be seen to extend from a bottom side of the package substrate to the top side of the package substrate to provide electrical isolation between the plurality of pins. Mold is shown as 286.

The circuitry 180 comprises circuit elements (including transistors, and generally also diodes, resistors, capacitors, etc.) that may be optionally formed in an epitaxial layer on the substrate 105 in the case of a bulk substrate material such as silicon. As noted above in one arrangement the IC die 120 comprises a power IC die, and the circuitry 180 is generally configured together for realizing a power function such as that of amplifier or a power converter. In this case the IC die 120 is not an IC power die, the IC die 120 can implement other functions including radio frequency (RF), digital, or non-volatile memory functions.

Figure 3A:
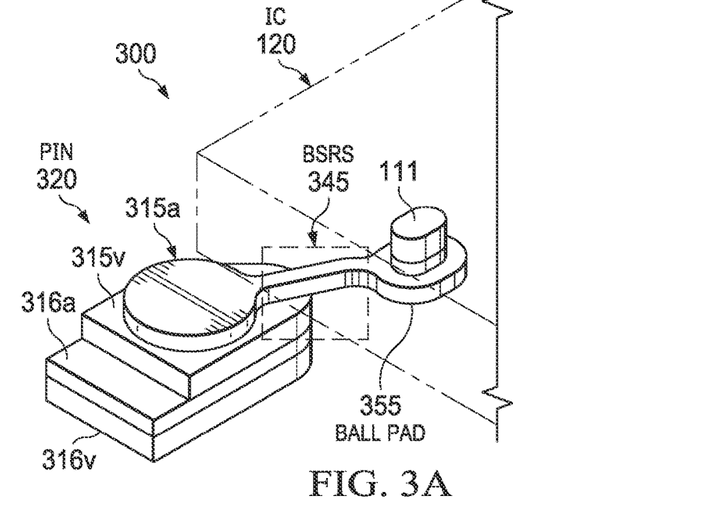
FIG. 3A depicts a side perspective view of a portion of a flipchip semiconductor package showing a pin of a package substrate that includes a swan neck BSRS.

FIG. 3A depicts a side perspective view of a portion of a flipchip semiconductor package 300 showing a pin 320 of a package substrate that includes what is termed herein a swan neck BSRS 345. The package substrate includes a top metal layer portion shown as 315a above a top metal filled via 315v, and there is a top dielectric layer lateral to the pin 320 and thus not shown, described elsewhere in this description as 315b. There is a bottom metal layer shown as 316a on a metal via layer 316v that provides an externally accessible bottom side contact pad, such as for mounting onto a printed circuit board (PCB). The bottom layer also includes a bottom dielectric layer portion lateral to the pin 320 described elsewhere in this description as 316b that is not shown in FIG. 3A.

The swan neck BSRS 345 is positioned along a length of a connector portion of the pin 320 that is between and the IC bondable portion shown as a ball pad 355 that is electrically connected by the connector portion to the bottom metal layer portion 316a. The swan neck BSRS 345 can be seen to be significantly thinner in metal line width, being at least 10% thinner in line width, typically at least 20% thinner in line width, as compared to a width of the ball pad 355, with the swan neck BSRS 345 shown optionally spanning along its full length. In contrast, for a HOTROD package the metal portion that connects to the ball pad for the I/O pins has at least the same width as the ball pad 355 adjacent to the ball pad, and is significantly wider as compared to the width of the ball pad 355 as one moves closer to the contact pad.

It is recognized herein that because the swan neck BSRS 345 has significantly less metal line width, this reduction reduces the anchoring impact to a pillar 111 on a bond pad of an IC die 120, which help to reduce cracking risk of the associated solder joint, or other electrically conductive material interconnect, between the pillar 111 and the package substrate. Although the swan neck BSRS 345 is shown being implemented for one of the I/O pins, the swan neck BSRS 345 as well as some of the other disclosed BSRS's can also be implemented for the GND, VIN, or the power bus(es).

Figure 3B:
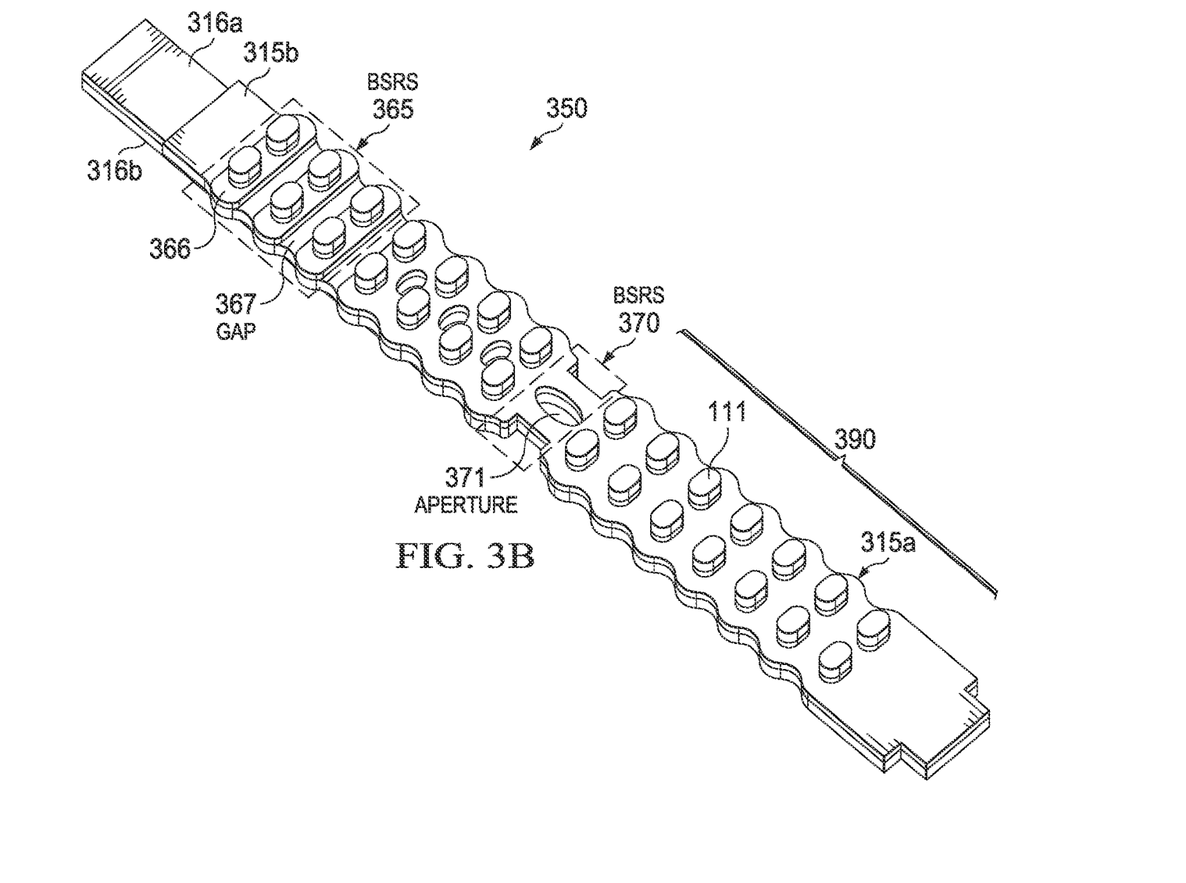
FIG. 3B depicts a side perspective view of a pin shown as a bus bar of a multilevel package substrate that functions as an IC bondable portion, where the bus bar is shown including a first BSRS shown as an island slotting BSRS comprising a plurality of metal islands and a second BSRS shown as a swiss cheese slotting comprising a plurality of apertures

Disclosed semiconductor packages can include one or more pins that include two or more different BSRS. FIG. 3B depicts a side perspective view of a pin shown as a bus bar 350 of a multilevel package substrate that functions as an IC bondable portion, shown having the bonding features of the IC die as pillars 111 thereon, where the bus bar 350 is shown including a plurality of different BSRS's. The BSRS's comprise a first BSRS shown as an island slotting BSRS 365 comprising a plurality of metal islands 366 formed in the top metal layer 315a that are electrically isolated from one another by gaps 367 that reduces the coverage area of the top metal layer 315a for the bus bar 350.

Conventional pins, such as the signal I/O's can also utilize the island slotting BSRS 365. Regarding the island slotting BSRS 365, although not shown the respective metal islands 366 are electrically coupled to one another by filled vias (such as comprising copper) that connect to what can be termed a bridge provided by the bottom metal layer of the package substrate. The second BSRS is shown as a swiss cheese slotting BSRS 370 comprising a plurality of apertures 371 formed in the top metal layer 315a that reduces the effective metal line width of the top metal layer 315a. However, the respective BSRS's can extend through multiple metal layers.

The island slotting 365 and swiss cheese slotting BSRS 370 analogous to BSRS 345 described above have significant dimensional changes in metal coverage area and in metal line width, respectively, each being at least 10% less, such as being at least 20% less, in their respective dimension (s) as compared to the remainder of the bus bar 350 pin that does not include the BSRS shown as 390. Both the island slotting BSRS 365 and swiss cheese slotting BSRS 370 help to reduce the cracking risk of the solder joint, or other electrically conductive material interconnect, between the bonding feature on the IC such as a pillar 111, and a pin such as the bus bar 350.

Figure 3C:
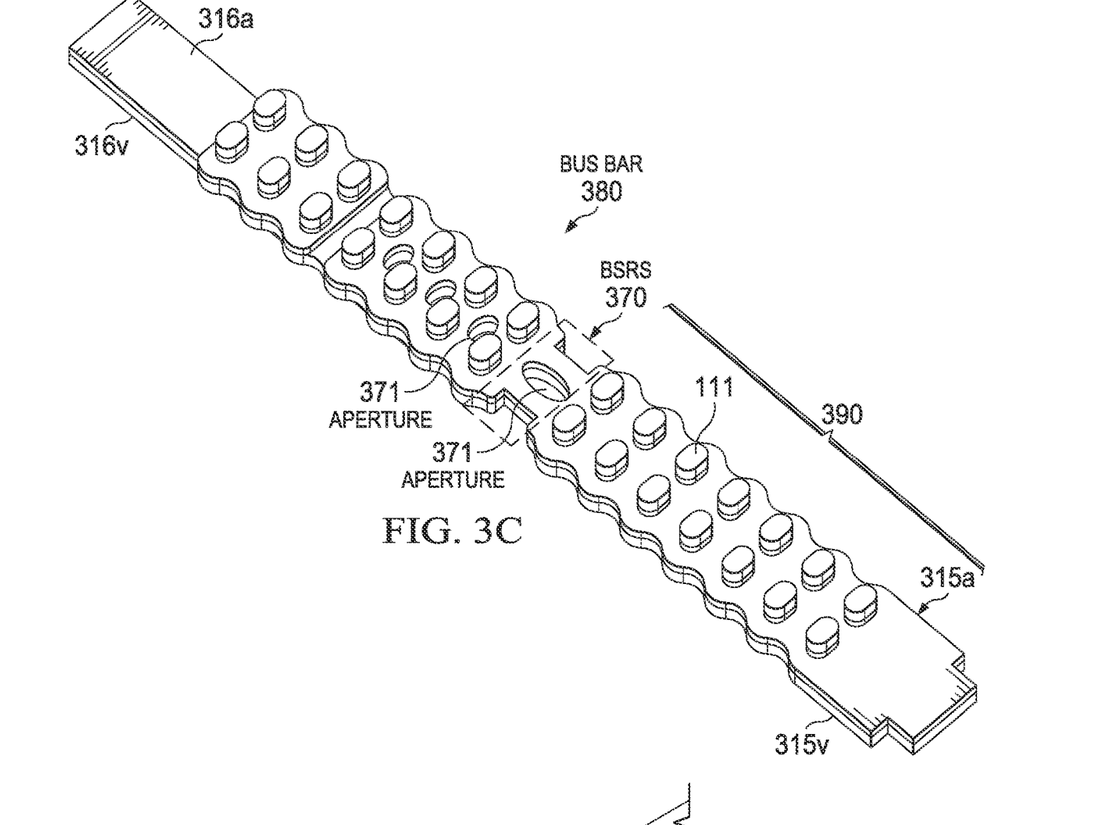
FIG. 3C depicts a side perspective view of a portion of a flipchip semiconductor package, where the multilevel package substrate includes a disclosed swiss cheese slotting BSRS.

FIG. 3C depicts a side perspective view of a bus bar 380 of a disclosed multilevel package substrate that includes the swiss cheese slotting BSRS 370 shown in FIG. 3B, here being the only BSRS type utilized by the bus bar 380 shown near the middle of the length of the bus bar 380. Pillar 111 connections, such as solder as the interconnect material, within the BSRS 370 and adjacent portions of the bus bar 380 having a reduced metal line width as described above helps to reduce the risk cracking of the solder joint, or other or other electrically conductive material interconnect, between a pillar 111 or other bonding feature on bond pads of the IC die and the pin, such as the bus bar 380 shown. Although the BSRS is shown applies to a busbar in this example, the swiss cheese slotting BSRS 370 can generally be applied to any type of pin, including structures comparable to the I/O pins shown in FIG. 1A.

Figure 3D:
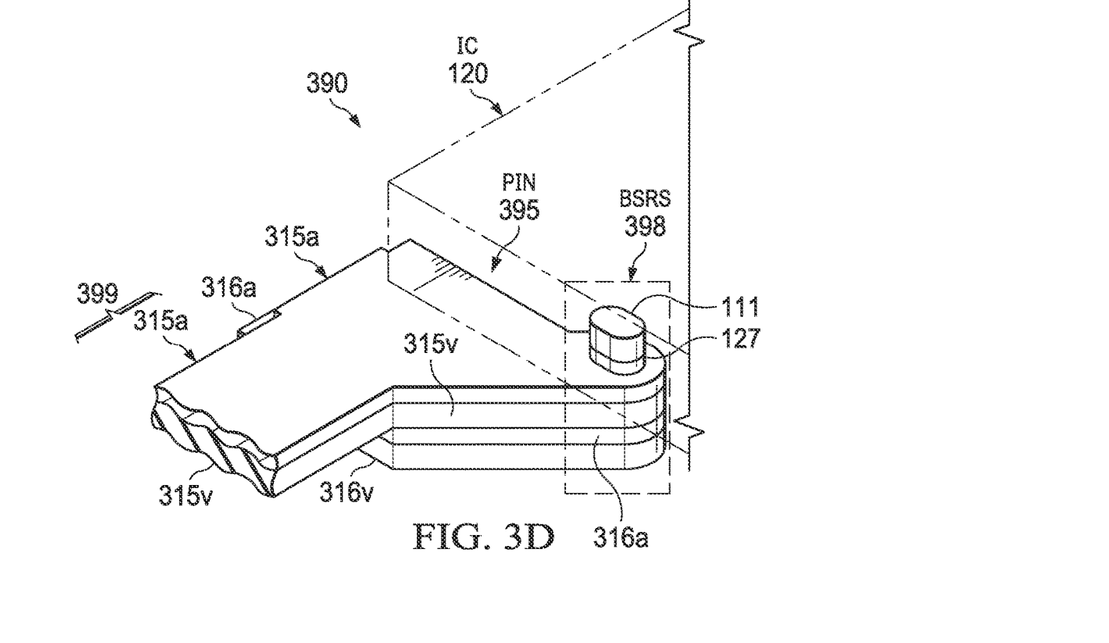
FIG. 3D depicts a side perspective view of a portion of a portion of a flipchip semiconductor package, where a pin of a multilevel package substrate is shown including a vertical stress buffer.

FIG. 3D depicts a side perspective view of a portion of a flipchip semiconductor package 390, showing a pin 395 of the package substrate including a BSRS shown as BSRS 398 that can be considered a vertical stress buffer. The BSRS 398 with its substantially higher thickness in an area on the distal end of the pin 395 that receives the pillar 111 as compared to the rest of the pin is recognized to increase the bending stiffness to become more resistant to bending, which can help to reduce the cracking risk for the solder joint shown as 127a between the pillar 111 and the pin 395. The thickness of the BSRS 398 can be a full thickness of the multilevel package substrate, providing significant dimensional changes in thickness of at least 10% thicker, such as being at least 20% thicker, as compared to the remainder of the pin 395 shown as 399 that does not include the BSRS. BSRS 398 can be generally be used for any type of pin including I/O pins and bus bars.

FIGS. 4A-I depict successive cross-sectional views of an assembly method for forming a disclosed multilayer package substrate. Although not shown, multiple ones of the multilayer package substrate can be processed together as a panel (or a sheet). All metal layers described below can comprise copper or a copper alloy.

Figure 4A:
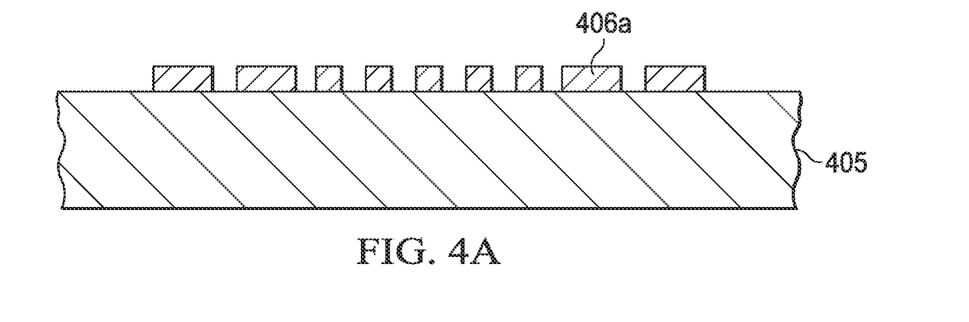
FIG. 4A shows in-process results after forming a bottom metal layer with a pattern on a metal carrier, such as by using an electroplating process.
Figure 4B:
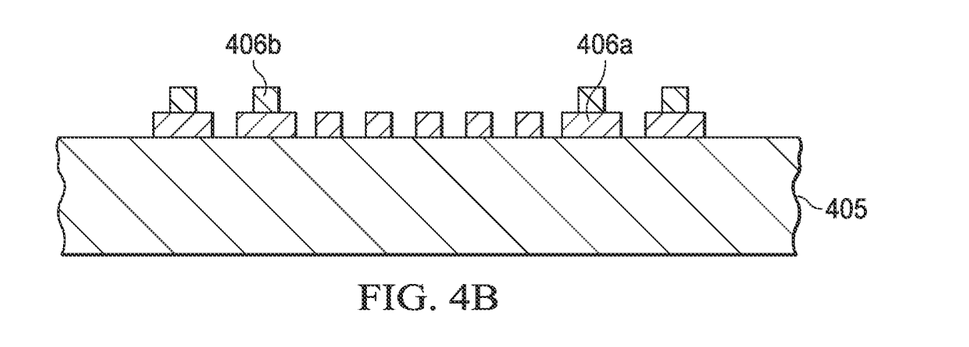
FIG. 4B shows in-process results after forming posts, such as comprising copper, on the metal portions of the bottom metal layer.
Figure 4C:
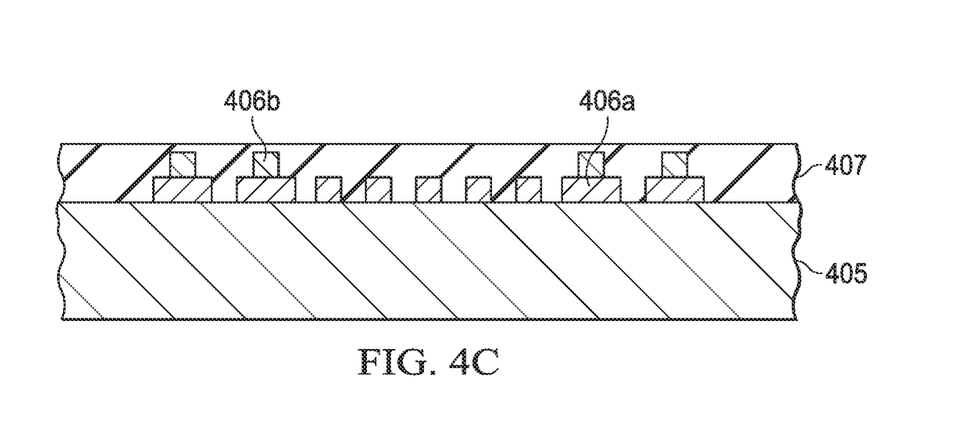
FIG. 4C shows in-process results after forming a bottom dielectric layer, such as using a compression molding process.
Figure 4D:
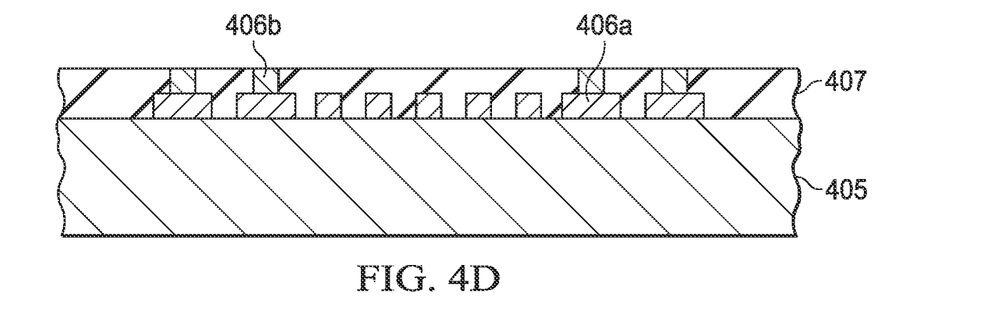
FIG. 4D shows results after grinding the bottom dielectric layer mold material to expose the posts.

FIG. 4A shows in-process results after forming a patterned bottom metal layer 406a of a bottom layer on a metal carrier 405, such as by using an electroplating process. The bottom metal layer provides what is disclosed above is being the bottom filled vias 116v. FIG. 4B shows in-process results after forming posts 406b that can be referred to as being pillars, such as comprising copper, on the patterned metal layer 406a. The posts 406b provide what is referred to above is being bottom metal layer 116a. FIG. 4C shows in-process results after forming the bottom dielectric layer 407, shown above as 116b, such as using a compression molding process. FIG. 4D shows results after grinding the bottom dielectric layer 407 to expose the posts 406b, which completes the bottom layer.

Figure 4E:
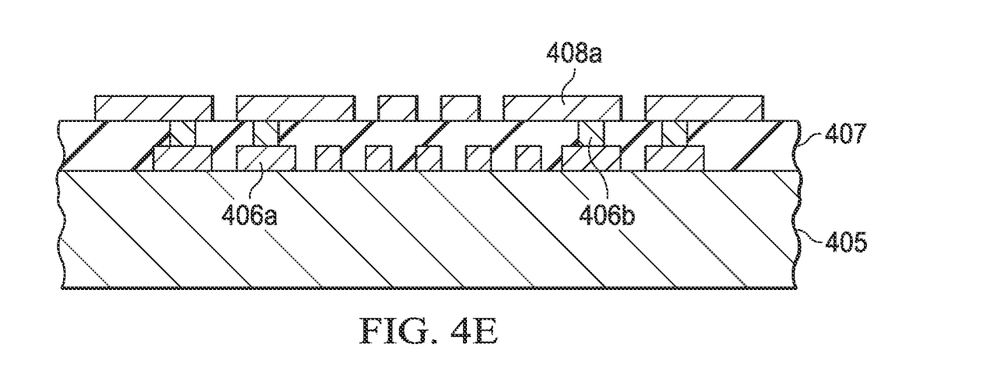
FIG. 4E shows in-process results after forming a top metal layer with a pattern over the posts.
Figure 4F:
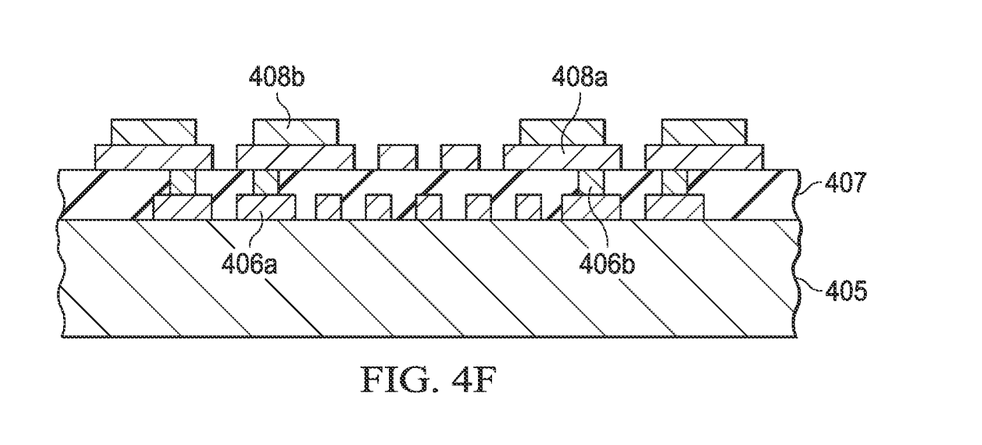
FIG. 4F shows in-process results after another plating process that deposits metal, such as for providing ball pads, by plating on top of the features of the posts.
Figure 4G:
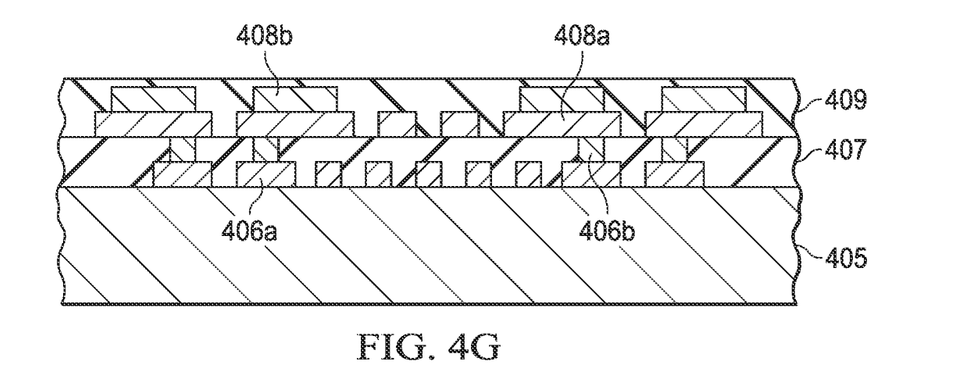
FIG. 4G shows in-process results after forming a top dielectric layer, such as again using a compression molding process.
Figure 4H:
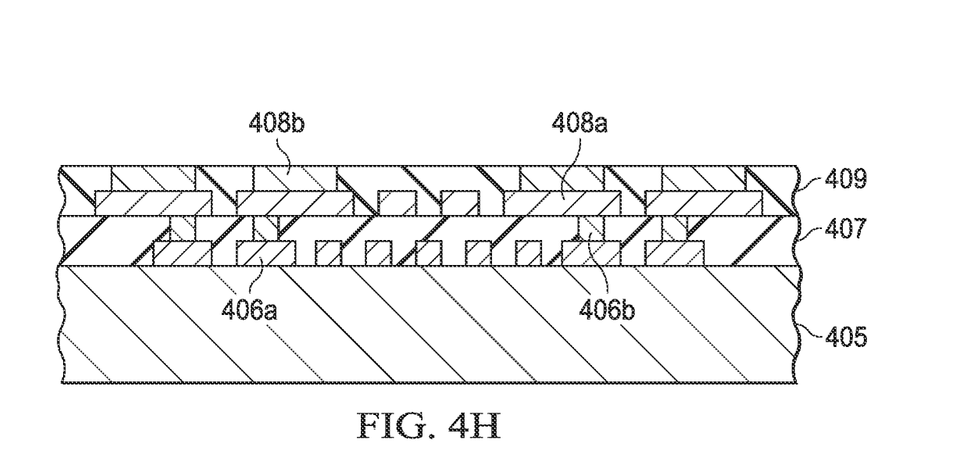
FIG. 4H shows in-process results after grinding the top dielectric layer to expose the ball pads.
Figure 4I:
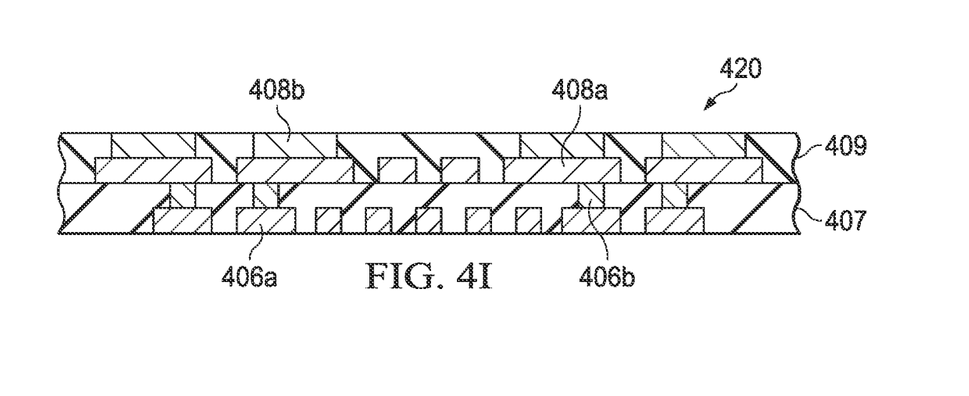
FIG. 4I shows in-process results after removing the metal carrier to complete the package substrate.

FIG. 4E shows in-process results after forming a patterned top metal layer 408a, shown above as top filled vias 115v, over the posts 406b. FIG. 4F shows in-process results after another plating process that deposits metal for providing ball pads shown as 408b, such as by plating on top of the respective features of the patterned top metal layer 408a, shown above as top metal layer 115a. FIG. 4G shows in-process results after forming a top dielectric layer 409, such as again using a compression molding process. FIG. 4H shows in-process results after grinding the top dielectric layer 409 to expose the ball pads 408b. FIG. 4I shows in-process results after removing the metal carrier to complete the top layer and thus the multilayer package substrate, which is shown as 420, that can also be represented by the package substrate 210 shown in FIG. 2 described above.

A wafer comprising a plurality of IC generally then has solder applied to its bonding features such as pillars on its bond pads. Solder can be applied generally by using either a dipping process or by a solder paste application process. Following wafer singulation, individual IC die are picked and flipchip placed onto the pins of the package substrate 420. As an alternative to applying solder to the pillars 111 while in wafer form, is it also possible to apply the solder to the surface of the package substrate, or providing solder in both of these places to make the connection between the pillars and the pins of the package substrate. In a typical assembly process, there is a sawing process to provide individual ones of the flipchip semiconductor package from a panel of flipchip semiconductor packages.

EXAMPLES

Disclosed aspects are further illustrated by the following specific Examples, which should not be construed as limiting the scope or content of this Disclosure in any way.

This Example describes and includes simulated mechanical modeling data performed for evaluating the cracking risk of solder connections between copper pillars on disclosed pins having at least one BSRS of a disclosed multilayer package substrate, as compared to the same copper pillar on leads of a commercially available flipchip on lead structures being the HOTROD packages from Texas Instruments that comprises a flipchip Quad Flat No Leads (QFN) package specifically designed for power applications. The HOTROD package is known to provide good reliability for the solder connections between the pillars on the IC die and the leads.

Figure 5A:
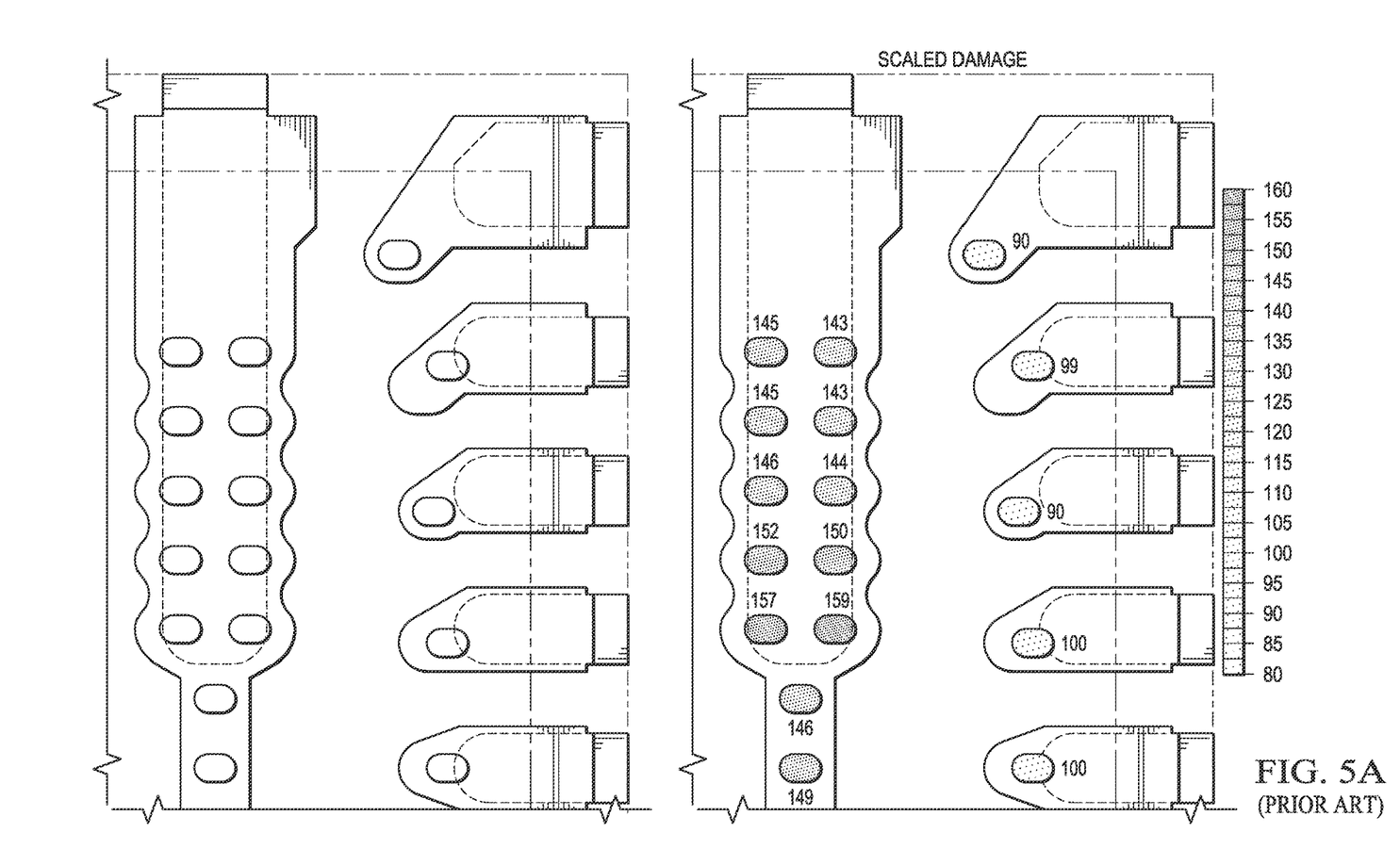
FIG. 5A and FIG. 5B show numerical modeling results that compares the solder joint cracking risk for solder under each individual copper pillar, with results for a flipchip semiconductor package being a HOTROD leadframe in FIG. 5A and results for a disclosed multilayer package substrate having at least one BSRS in FIG. 5B that evidences the solder joint cracking risk was significantly reduced by adding to the pins of the flipchip semiconductor package any of the above-described BSRS's.
Figure 5B:
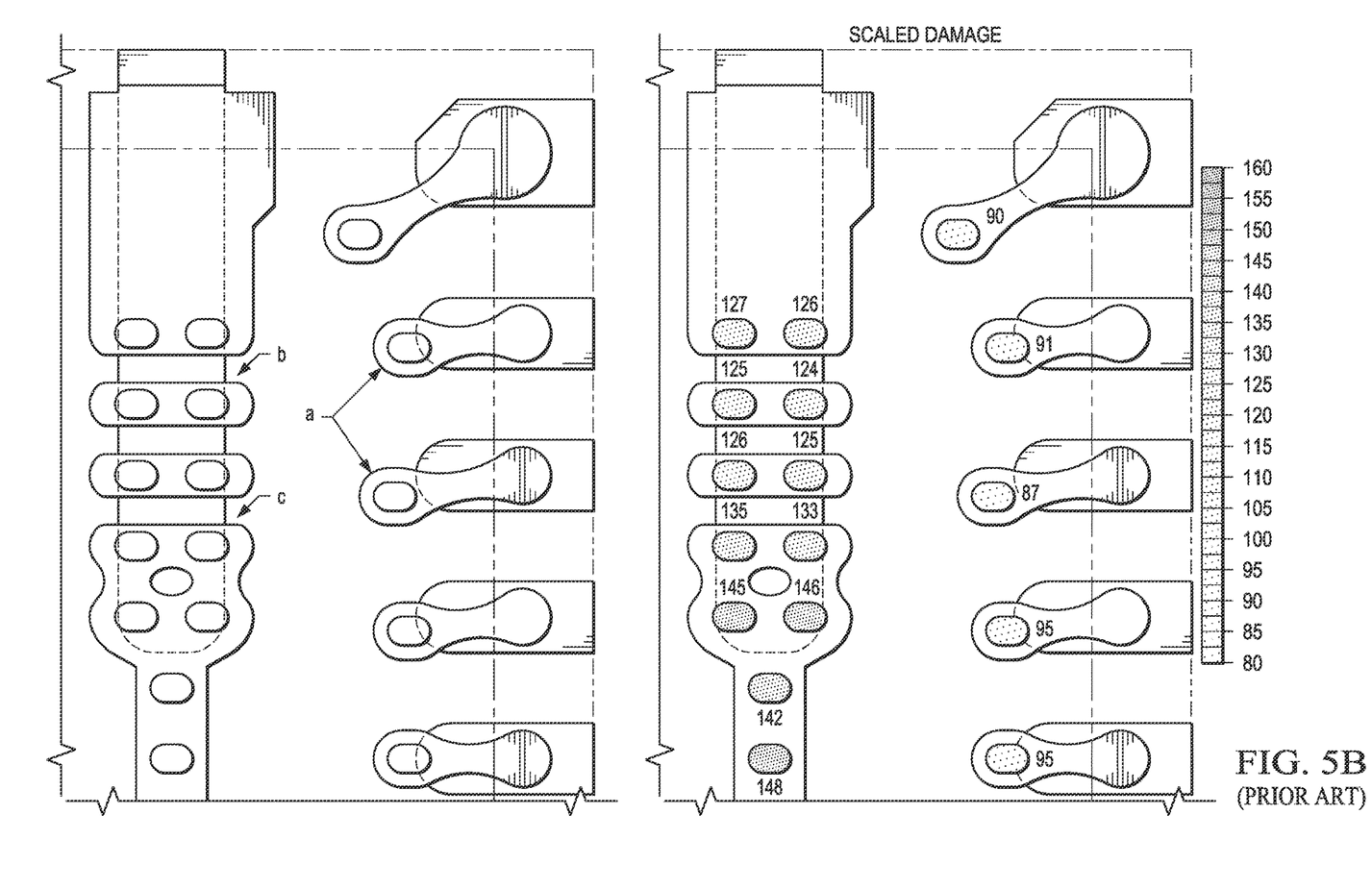

Regarding the modeling methodology, a quarter size model (one-fourth of the actual full package size) was simulated. The modeling simulated the chip level temperature cycle condition (chip level reliability (CLR) temperature coefficient (TC)) from −65° C. to 150° C. For the simulation, the copper pillars were held constant for both cases simulated, and only the leadframe structure was changed. The disclosed BSRS's tested included the "swan neck" BSRS 345 described above relative to FIG. 3A shown in FIG. 5B as "a", and "island slotting" BSRS 365 described above relative to FIG. 3B shown in FIG. 5B as "b", and a "swiss cheese slotting" BSRS described above relative to FIG. 3B and FIG. 3C shown in FIG. 5B as "c".

Regarding results and conclusions, the modeling performed evidences that the solder joint cracking risk was significantly reduced by adding any of the above-described BSRS's. The numerical values in the scaled damage maps shown in FIG. 5A (HOTROD leadframe) and in FIG. 5B (a disclosed multilayer package substrates having at least one BSRS) evidence the solder joint cracking risk for the solder under each individual copper pillar. The larger the number, the higher the cracking risk of the solder joint. The respective BSRS's all provide at least a 20% reduction in the cracking risk of the solder joints, although it is expected that the approximately the same cracking risk reduction would apply to other electrically conductive interconnect materials. This data provides clear evidence that disclosed BSRS's have a significant effect in reducing the cracking risk of the electrically conductive interconnect materials including solder.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:
1. A multilayer package substrate, comprising:
a top layer including a top dielectric layer and a top metal layer including top side contact pads providing at least a top portion for a plurality of pins on top filled vias, and a bottom layer including a bottom dielectric layer and a bottom metal layer on bottom filled vias that provide externally accessible bottom side contact pads, the top dielectric layer together with the bottom dielectric layer providing electrical isolation between the plurality of pins;
wherein the top side contact pads comprise an integrated circuit (IC) bondable portion that is configured for an electrically conductive material interconnect to provide a connection to bonding features on bond pads of an IC die;
wherein at least a first pin of the plurality of pins includes at least one bump stress reduction structure (BSRS) that includes a physical dimension difference in the top metal layer of at least 10% in at least one dimension relative to the top metal layer of at least one side of the first pin bordering the BSRS.

2. The multilayer package substrate of claim 1, wherein the electrically conductive material interconnect comprises solder.

3. The multilayer package substrate of claim 1, wherein the plurality of pins collectively comprise a plurality of input/output (I/O) pins, a ground pin, and at least one power bus bar.

4. The multilayer package substrate of claim 1, wherein the BSRS is oriented along an x-y plane that is perpendicular to a thickness direction of the first pin, and wherein the IC bondable portion comprises a ball pad that is connected by a connector portion to one of the top side contact pads, and wherein the BSRS comprises at least one of a first BSRS that is thinner in line width of the top metal layer, second BSRS that comprises a plurality of spaced apart islands of the top metal layer, and a third BSRS that comprises a plurality of apertures formed in the top metal layer.

5. The multilayer package substrate of claim 1, wherein the BSRS is oriented along a thickness direction of the first pin, and wherein the BSRS comprises a vertical stress buffer that has a higher thickness in an area on a distal end of the first pin as compared to a rest of the first pin.

6. The multilayer package substrate of claim 1, wherein the BSRS includes a first BSRS and second BSRS that is a different type as compared to the first BSRS.

7. The multilayer package substrate of claim 1, wherein the multilayer package substrate consists of the top layer and the bottom layer.

8. The multilayer package substrate of claim 1, wherein the multilayer package substrate is configured as a quad flat no lead (QFN) package.

9. The multilayer package substrate of claim 1, wherein the local physical dimension change is at least 20%.

10. A semiconductor package, comprising:
a multilayer package substrate comprising a top layer including a top dielectric layer and a top metal layer providing at least a top portion of a plurality of pins on top filled vias, and a bottom layer including a bottom dielectric layer and a bottom metal layer on bottom filled vias that provide externally accessible bottom side contact pads, the top dielectric layer together with the bottom dielectric layer providing electrical isolation between the plurality pins;
an integrated circuit (IC) die that comprises a substrate having a semiconductor surface including circuitry, with nodes in the circuitry connected to bond pads with bonding features on the bond pads,
an electrically conductive material interconnect providing a connection between the top side contact pads and the bonding features; and
wherein at least a first pin of the plurality of pins includes at least one bump stress reduction structure (BSRS) that includes a physical dimension difference in the top metal layer of at least 10% in at least one dimension as compared to the top metal layer portion in a non-BSRS portion of the first pin.

11. The semiconductor package of claim 10, wherein the BSRS is oriented along an x-y plane that is perpendicular to a thickness direction of the first pin, and wherein the IC bondable portion comprises a ball pad that is connected by a connector portion to one of the top side contact pads, and wherein the BSRS comprises at least one of a first BSRS that is thinner in line width of the top metal layer, a second BSRS that comprises a plurality of spaced apart islands of the top metal layer, and a third BSRS that comprises a plurality of apertures formed in the top metal layer.

12. The semiconductor package of claim 10, wherein the local physical dimension change is at least 20%.

13. The semiconductor package of claim 10, wherein the BSRS is oriented along a thickness direction of the first pin, and wherein the BSRS comprises a vertical stress buffer.

14. The semiconductor package of claim 10, wherein the BSRS includes a first BSRS and a second BSRS, and wherein the electrically conductive material interconnect comprises solder.

15. A method, comprising:
forming a multilayer package substrate, comprising:
forming a top layer including a top dielectric layer and a top metal layer providing at least a top portion of a plurality of pins on top filled vias, and a bottom layer including a bottom dielectric layer and a bottom metal layer on bottom filled vias that provide externally accessible bottom side contact pads, the top dielectric layer together with the bottom dielectric layer providing electrical isolation between the plurality pins;
attaching bonding features of an integrated circuit (IC) die with nodes in circuitry connected to bond pads with the bonding features on the bond pads to the top side contact pads using an electrically conductive material interconnect; and
wherein forming at least a first pin of the plurality of pins includes forming at least one bump stress reduction structure (BSRS) that includes a physical dimension size difference in the top metal layer of at least 10% in at least one dimension as compared to the top metal layer portion in a non-BSRS portion of the first pin.

16. The method of claim 15, wherein the BSRS is oriented along an x-y plane that is perpendicular to a thickness direction of the first pin, wherein the IC bondable portion comprises a ball pad that is connected by a connector portion to one of the top side contact pads, and wherein the BSRS comprises at least one of a first BSRS that is thinner in line width of the top metal layer, a second BSRS that comprises a plurality of spaced apart islands of the top metal layer, and a third BSRS that comprises a plurality of apertures formed in the top metal layer.

17. The method of claim 15, wherein the local physical dimension change is at least 20%.

18. The method of claim 15, wherein the BSRS is oriented along a thickness direction of the first pin, and wherein the BSRS comprises a vertical stress buffer.

19. The method of claim 15, wherein the BSRS includes a first BSRS and a second BSRS.

20. The method of claim 15, wherein the bonding features comprise solder capped copper pillars.

* * * * *